United States Patent
Tang et al.

(10) Patent No.: US 10,860,143 B2
(45) Date of Patent: Dec. 8, 2020

(54) DISPLAY DEVICE WITH FINGERPRINT RECOGNITION FUNCTION UTILIZING A COLLIMATOR AND LENS ASSEMBLY

(71) Applicants: BOE Technology Group Co., Ltd., Beijing (CN); Chengdu BOE Optoelectronics Technology Co., Ltd., Chengdu (CN)

(72) Inventors: Guoqiang Tang, Beijing (CN); Benlian Wang, Beijing (CN); Haijun Qiu, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 16/170,704

(22) Filed: Oct. 25, 2018

(65) Prior Publication Data
US 2019/0294298 A1   Sep. 26, 2019

(30) Foreign Application Priority Data

Mar. 21, 2018 (CN) .......................... 2018 1 0235879

(51) Int. Cl.
*G06F 3/042*    (2006.01)
*G06F 3/041*    (2006.01)
(Continued)

(52) U.S. Cl.
CPC .......... *G06F 3/0421* (2013.01); *G06F 3/0412* (2013.01); *G06K 9/0004* (2013.01); *H03K 17/941* (2013.01)

(58) Field of Classification Search
CPC ........... G06F 1/1692; G06F 2203/0338; G06F 3/0304; G06F 3/0412; G06F 3/0418;
(Continued)

(56) References Cited

U.S. PATENT DOCUMENTS

2017/0220844 A1*  8/2017  Jones ................... G06K 9/0053
2017/0249494 A1*  8/2017  Zhang ................ G06K 9/00013
(Continued)

FOREIGN PATENT DOCUMENTS

CN    104992158 A   10/2015
CN    106845436 A    6/2017
(Continued)

OTHER PUBLICATIONS

Office Action dated Apr. 14, 2020 for Chinese Application No. 201810235879.6.

*Primary Examiner* — Keith L Crawley
(74) *Attorney, Agent, or Firm* — Arent Fox LLP; Michael Fainberg

(57) ABSTRACT

The disclosure discloses a fingerprint recognition display device, the fingerprint recognition display device includes: a display panel, a fingerprint recognition sensor arranged on another side of the display panel than a light-emitting side thereof, and a lens assembly and a collimator arranged between the fingerprint recognition sensor and the display panel; wherein the collimator is arranged on a surface of the display panel facing away from the light-emitting side, and the lens assembly is arranged on a surface of the collimator on a side thereof facing away from the display panel, wherein a size of the fingerprint recognition sensor is smaller than a size of the display panel; the collimator is configured to receive light rays reflected by a finger, and to convert the light rays into collimated light incident on the lens assembly; and the lens assembly is configured to converge the collimated light onto the fingerprint recognition sensor.

17 Claims, 4 Drawing Sheets

(51) Int. Cl.
*G06K 9/00* (2006.01)
*H03K 17/94* (2006.01)

(58) Field of Classification Search
CPC ...... G06F 3/042; G06F 3/0421; G06F 3/0488;
G06K 9/00006; G06K 9/00013; G06K
9/00026; G06K 9/0004; G06K 9/00046;
H03K 17/941
See application file for complete search history.

(56) References Cited

U.S. PATENT DOCUMENTS

| | | | |
|---|---|---|---|
| 2017/0286743 A1* | 10/2017 | Lee | G02B 5/201 |
| 2018/0046837 A1* | 2/2018 | Gozzini | G06K 9/0004 |
| 2018/0268194 A1* | 9/2018 | Lin | G06K 9/00046 |
| 2019/0026522 A1 | 1/2019 | Wang et al. | |
| 2019/0180072 A1* | 6/2019 | Fomani | G06K 9/0004 |
| 2019/0228203 A1* | 7/2019 | Kim | G06K 9/0004 |
| 2019/0251326 A1 | 8/2019 | Sun | |
| 2019/0272410 A1* | 9/2019 | Wang | G06K 9/0004 |

FOREIGN PATENT DOCUMENTS

| | | |
|---|---|---|
| CN | 107330426 A | 11/2017 |
| CN | 107480584 A | 12/2017 |
| EP | 0905646 A | 3/1999 |

\* cited by examiner

DISPLAY DEVICE WITH FINGERPRINT RECOGNITION FUNCTION UTILIZING A COLLIMATOR AND LENS ASSEMBLY

CROSS-REFERENCE TO RELATED APPLICATION

This application claims priority to Chinese Patent Application No. 201810235879.6, filed on Mar. 21, 2018, the content of which is incorporated by reference in the entirety.

TECHNICAL FIELD

This disclosure relates to the field of display technologies, and particularly to a fingerprint recognition display device.

DESCRIPTION OF THE RELATED ART

A fingerprint recognition display device in the related art generally includes a display panel and a fingerprint recognition sensor, where the fingerprint recognition sensor typically has a full-screen area, and the cost of the fingerprint recognition sensor is dependent upon a size thereof in that there is a higher cost of the fingerprint recognition sensor with a larger size, so the cost of the fingerprint recognition display device in the related art remains high.

In view of this, it is highly desirable for those skilled in the art to recognize a fingerprint in a full-screen mode using a fingerprint recognition sensor with a small size to thereby lower the cost of a product.

SUMMARY

Embodiments of the disclosure provide a fingerprint recognition display device.

In an aspect, the embodiments of the disclosure provide a fingerprint recognition display device including: a display panel, a fingerprint recognition sensor arranged on another side of the display panel than a light-emitting side thereof, and a lens assembly and a collimator arranged between the fingerprint recognition sensor and the display panel; wherein the collimator is arranged on a surface of the display panel facing away from the light-emitting side, and the lens assembly is arranged on a surface of the collimator on a side thereof facing away from the display panel, wherein: a size of the fingerprint recognition sensor is smaller than a size of the display panel; the collimator is configured to receive light rays reflected by a finger, and to convert the light rays into collimated light incident on the lens assembly; and the lens assembly is configured to converge the incident collimated light onto the fingerprint recognition sensor.

In some embodiments, an orthographic projection of the lens assembly onto a plane where the display panel lies completely coincides with the display panel; and an orthographic projection of the collimator onto the plane where the display panel lies completely coincides with the display panel.

In some embodiments, the lens assembly includes a plurality of lens areas, the fingerprint recognition sensor includes a plurality of recognition areas, and the plurality of lens areas correspond to the plurality of recognition areas in a one-to-one manner; and a lens in each of the plurality of lens areas is configured to converge collimated light incident on each of the plurality of lens areas onto a corresponding recognition area of the fingerprint recognition sensor to form a fingerprint image.

In some embodiments, the lens in each of the plurality of lens areas is configured to converge the collimated light incident on each of the plurality of lens areas onto the corresponding recognition area of the fingerprint recognition sensor to form a part of the fingerprint image; and the fingerprint recognition sensor is further configured to integrate a plurality of parts of the fingerprint image into a complete fingerprint image.

In some embodiments, the lens in each of the plurality of lens areas is configured to converge the collimated light incident on each of the plurality of lens areas onto the corresponding recognition area of the fingerprint recognition sensor to form a complete fingerprint image.

In some embodiments, refractive indexes of respective lenses in a same lens area are same, and refractive indexes of respective lens areas decrease gradually from an edge region of the lens assembly to a center of a region in the lens assembly that faces the fingerprint recognition sensor.

In some embodiments, a center of the fingerprint recognition sensor coincides with a center of the lens assembly; and refractive indexes of lenses in respective lens area distributed central-symmetrically around the center of the lens assembly are same.

In some embodiments, lens materials of respective lens areas with different refractive indexes are different, and refractive indexes of different lens materials are different.

In some embodiments, lens materials of respective lens areas with different refractive indexes are same, and doped with different kinds of dopants.

In some embodiments, the dopants include metallic balls or organic materials.

In some embodiments, lens materials of respective lens areas with different refractive indexes are same, and doped with a same kind of dopant at different dosages.

In some embodiments, the dopant includes metallic balls or an organic material.

In some embodiments, the lens in each of the plurality of lens areas includes: a first electrode, a second electrode, and an electro-optical material layer arranged between the first electrode and the second electrode; and a refractive index of each of the plurality of lens areas is controlled by voltage applied to the first electrode and the second electrode.

In some embodiments, the first electrode and the second electrode are transparent electrodes.

In some embodiments, a surface of the lens assembly proximate to the collimator is arranged as a flat surface and a surface of the lens assembly proximate to the fingerprint recognition sensor is arranged as a curved surface.

In some embodiments, shapes of respective lens areas are rectangles, circular sectors, semicircles, or circular rings; and shapes of respective recognition areas are rectangles, circular sectors, semicircles, or circular rings.

In some embodiments, the collimator is an optical collimator.

In some embodiments, the fingerprint recognition sensor includes a Complementary Metal Oxide Semiconductor (CMOS), or a Charge Coupled Diode (CDD).

In some embodiments, a gap exists between the lens assembly and the fingerprint recognition sensor; and air, or light transmitting filler with a uniform refractive index is filled in the gap.

In some embodiments, the display panel is an Organic Light-Emitting Diode (OLED) display panel or an inorganic light-emitting diode display panel.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

Figure 1:
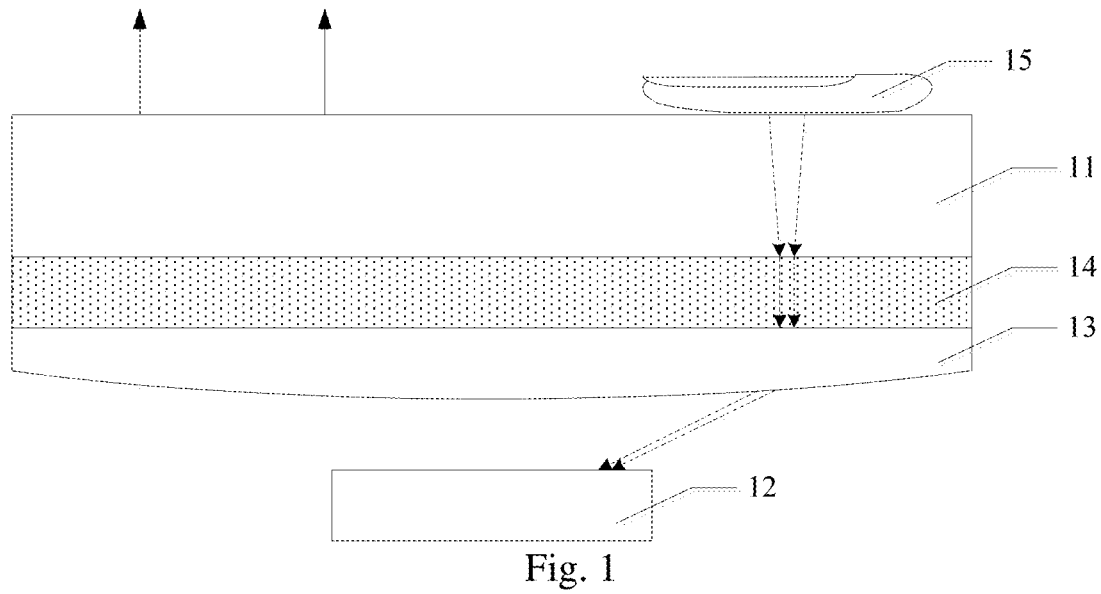
FIG. 1 is a schematic structural diagram of a fingerprint recognition display device according to the embodiments of the disclosure.

The technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the claimed scope of the disclosure.

It shall be noted that, the thickness and shapes of layers in the drawings are not intended to reflect any real proportion, but only intended to illustrate the disclosure.

Referring to FIG. 1, a fingerprint recognition display device according to the embodiments of the disclosure includes: a display panel 11, a fingerprint recognition sensor 12 arranged on another side of the display panel 11 than a light-emitting side thereof (a light-emitting direction is as denoted by a solid arrow as illustrated in FIG. 1), and a lens assembly 13 and a collimator 14 arranged between the fingerprint recognition sensor 12 and the display panel 11, where the collimator 14 is arranged on a surface of the display panel 11 facing away from the light-emitting side, and the lens assembly 13 is arranged on a surface of the collimator 14 on a side thereof facing away from the display panel 11.

Here a size of the fingerprint recognition sensor 12 is smaller than a size of the display panel 11.

The collimator 14 is configured to receive light rays reflected by a finger 15 (denoted by a dotted arrow as illustrated in FIG. 1), and to convert the light rays into collimated light incident on the lens assembly 13.

The lens assembly 13 is configured to converge the incident collimated light onto the fingerprint recognition sensor 12.

In the fingerprint recognition display device above according to the embodiments of the disclosure, the collimator 14 receives the light rays reflected by the finger, and converts the light rays into the collimated light incident on the lens assembly 13, and then the lens assembly 13 converges the incident collimated light onto the fingerprint recognition sensor 12 with a small size to form a fingerprint image. Since the light rays reflected by the finger at any position on a screen can be converged onto the fingerprint recognition sensor 12 with a small size after passing the collimator 14 and the lens assembly 13, to form the fingerprint image, a fingerprint can be recognized in a full-screen mode using the fingerprint recognition sensor with a small size, thus lowering the cost of the product.

It shall be noted that, the display panel 11 is used for display and operates as a light source while a fingerprint is being recognized; where the display panel 11 is an Organic Light-Emitting Diode (OLED) display panel or an inorganic light-emitting diode display panel, for example, although the embodiments of the disclosure will not be limited thereto. Further, the structure of the display panel 11 is similar with a structure of a display panel in the related art, so a repeated description thereof will be omitted here.

In some embodiments, the collimator 14 is an optical collimator.

In some embodiments, the fingerprint recognition sensor 12 includes a Complementary Metal Oxide Semiconductor (CMOS), a Charge Coupled Diode (CDD), or another optical element.

In some embodiments, there is a gap between the lens assembly 13 and the fingerprint recognition sensor 12; where air, or light transmitting filler with a uniform refractive index, e.g., transparent polyimide (PI), can be filled in the gap.

In some embodiments, as illustrated in FIG. 1, an orthographic projection of the lens assembly 13 onto a plane where the display panel 11 lies completely coincides with the display panel 11, and an orthographic projection of the collimator 14 onto the plane where the display panel 11 lies completely coincides with the display panel 11, that is, both the lens assembly 13 and the collimator 14 cover the display panel 11 in a full-screen mode.

Figure 2:
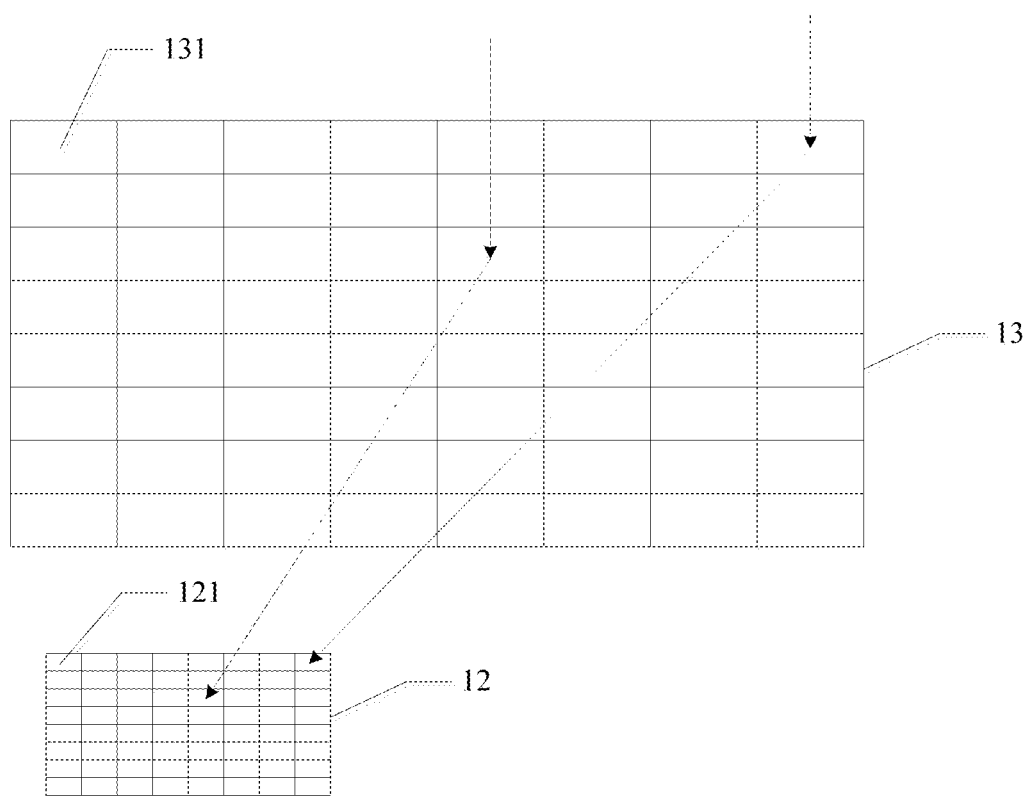
FIG. 2 is a top view of a lens assembly and a fingerprint recognition sensor in a fingerprint recognition display device according to the embodiments of the disclosure.

In some embodiments, as illustrated in FIG. 2, the lens assembly 13 includes a plurality of lens areas 131 (e.g., 8 areas by 8 areas), the fingerprint recognition sensor 12 includes a plurality of recognition areas 121 (e.g., 8 areas by 8 areas), and the plurality of lens areas 131 correspond to the plurality of recognition areas 121 in a one-to-one manner; where a lens (or lenses) in each lens area 131 is (or are) configured to converge collimated light incident on the lens area 131 onto a corresponding recognition area 121 of the fingerprint recognition sensor 12 to form a fingerprint image; where the number of areas can be set as needed in reality, although the embodiments of the disclosure will not be limited thereto.

It shall be noted that, the sizes of the plurality of lens areas may or may not be the same, the sizes of the plurality of recognition areas may or may not be the same, although the embodiments of the disclosure will not be limited thereto.

Figure 3:
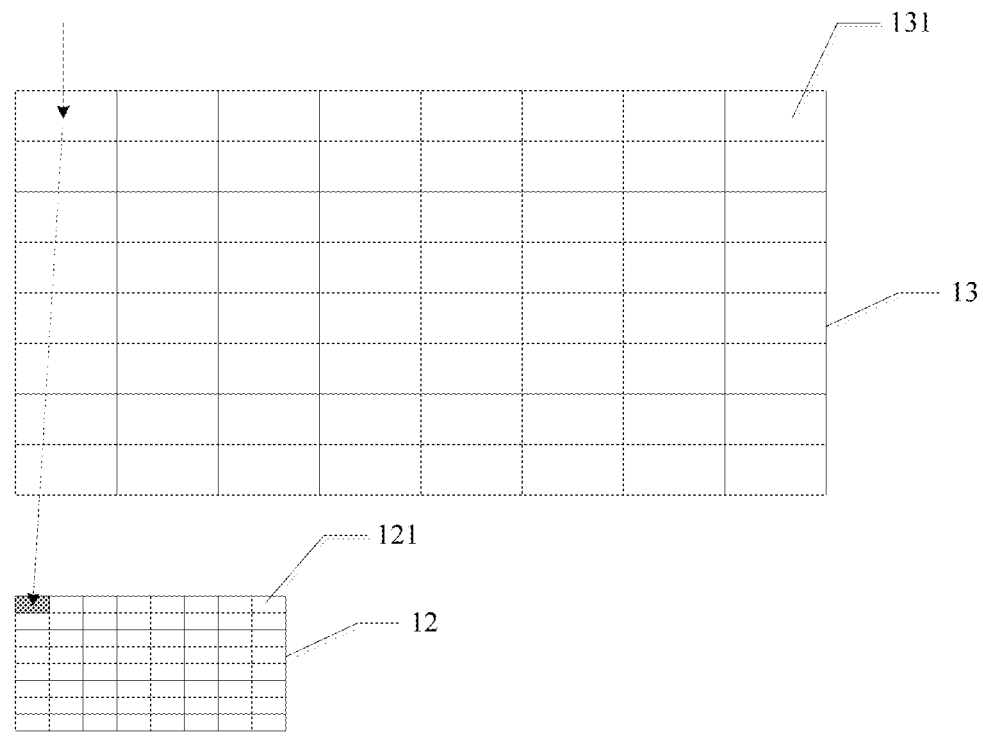
FIG. 3 is a first schematic diagram of a distribution of a fingerprint recognized by a fingerprint recognition display device according to the embodiments of the disclosure.
Figure 4:
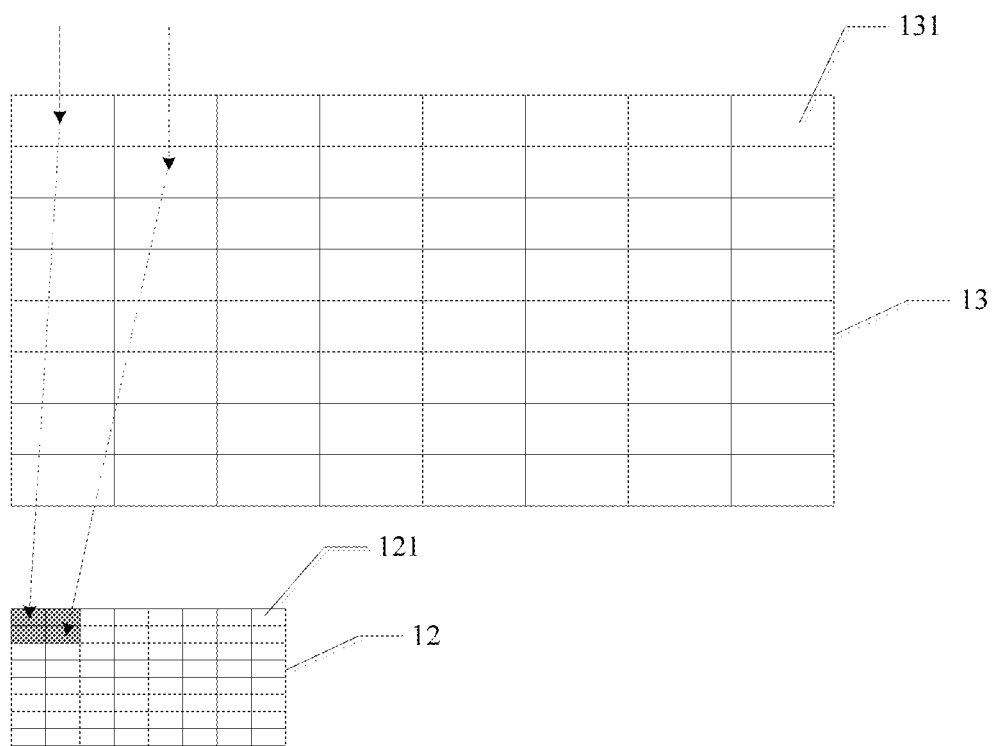
FIG. 4 is a second schematic diagram of a distribution of a fingerprint recognized by a fingerprint recognition display device according to the embodiments of the disclosure.

In some embodiments, the light rays converged by the lens (or lenses) in one lens area 131 can be imaged into a complete fingerprint image on the fingerprint recognition sensor 12 (the fingerprint is distributed in one area as shadowed in FIG. 3), or can be imaged thereon into a part of a fingerprint image (the fingerprint are distributed in four areas as shadowed in FIG. 4), although the embodiments of the disclosure will not be limited thereto.

In some embodiments, if the light rays converged by the lens (or lenses) in one lens area 131 are imaged into a part of a fingerprint image on the fingerprint recognition sensor 12, then as illustrated in FIG. 4, the lens (or lenses) in each lens area 131 is (or are) configured to converge the collimated light incident on the lens area into the corresponding recognition area 121 of the fingerprint recognition sensor 12 to thereby form a part of the fingerprint image.

Accordingly, the fingerprint recognition sensor 12 is further configured to integrate a plurality of parts of the fingerprint image into a complete fingerprint image. For example, the fingerprint recognition sensor 12 integrates the plurality of parts of the fingerprint image into the complete fingerprint image via an algorithm, where the algorithm can be an image processing algorithm in the related art, so a repeated description thereof will be omitted here.

In some embodiments, as illustrated in FIG. 2, refractive indexes of respective lenses in the same lens area 131 are the same, and refractive indexes of respective lens areas 131 decrease gradually from an edge region of the lens assembly 13 to a center of a region in the lens assembly 13 that faces the fingerprint recognition sensor 12.

Here the fingerprint recognition sensor 12 can be arranged at any position on the other side of the display panel 11 than the light-emitting side thereof, as long as the light rays converged by the lens assembly 13 can be incident on the fingerprint recognition sensor 12, although the embodiments of the disclosure will not be limited thereto.

Figure 5:
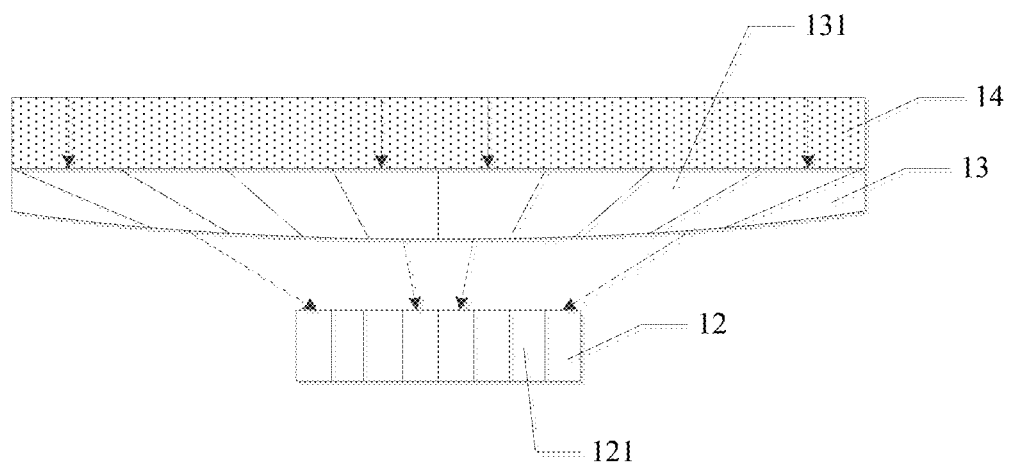
FIG. 5 is a schematic diagram of a lens assembly in a fingerprint recognition display device according to the embodiments of the disclosure in a sectional view.

In some embodiments, in order to converge the collimated light incident on a lens area 131 onto a corresponding recognition area 121 of the fingerprint recognition sensor, a surface of the lens assembly 13 proximate to the collimator is arranged as a flat surface, and a surface of the lens assembly 13 proximate to the fingerprint recognition sensor 12 is arranged as a curved surface, as illustrated in FIG. 5.

In some embodiments, the different refractive indexes of the lens areas can be embodied in the following implementations.

(1) Lens materials of respective lens areas with different refractive indexes are different, and refractive indexes of different lens materials are different.

For example, the lens assembly can be made of a number of materials with different refractive indexes as needed in reality, that is, the lens areas with the different refractive indexes are made of different materials, and the lens areas with the same refractive index are made of the same material.

(2) Lens materials of respective lens areas with different refractive indexes are the same, and doped with different kinds of dopants; where the dopants are metallic balls with a micro-nanometer size (e.g., metallic balls of cerium dioxide ($CeO_2$)), or organic materials with different refractive indexes (e.g., organic silicon).

For example, firstly a lens can be made of a transparent organic material, and then different kinds of metallic balls can be injected respectively into respective lens areas with different preset refractive indexes, while the same kind of metallic ball can be injected respectively into respective lens areas with the same preset refractive index.

(3) Lens materials of respective lens areas with different refractive indexes are the same, and doped with the same kind of dopant at different dosages; where the dopant can be metallic balls with a micro-nanometer size, or an organic material with a different refractive index.

For example, firstly a lens can be made of a transparent organic material, and then the same kind of metallic ball with different dosages can be injected respectively into respective lens areas with different preset refractive indexes, while the same kind of metallic ball with the same dosage can be injected respectively into respective lens areas with the same preset refractive index.

Figure 6:
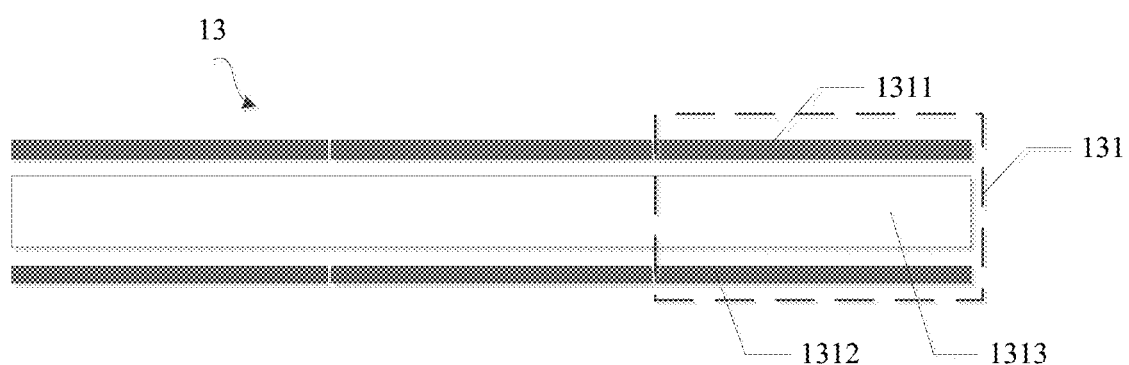
FIG. 6 is a schematic structural diagram of a lens assembly in a fingerprint recognition display device according to the embodiments of the disclosure.

(4) As illustrated in FIG. 6, a lens in any lens area 131 of the lens assembly 13 includes: a first electrode 1311, a second electrode 1312, and an electro-optical material layer 1313 arranged between the first electrode 1311 and the second electrode 1312; where a refractive index of an electro-optical material (e.g., potassium dideuterium phosphate (DKDP) crystals, or lithium tantalate (LT) crystals, etc.) of the electro-optical material layer 1313 varies with a varying electric field. In some embodiments, the electric field in the lens area 131 can be controlled by applying voltage to the first electrode 1311 and the second electrode 1312 to thereby control the refractive index of the lens area 131; where the first electrode 1311 and the second electrode 1312 are transparent electrodes, e.g., transparent Indium Tin Oxide (ITO) electrodes.

It shall be noted that the refractive indexes of the lens areas can alternatively be made different in a combination of the respective implementations above, although the embodiments of the disclosure will not be limited thereto.

Figure 7:
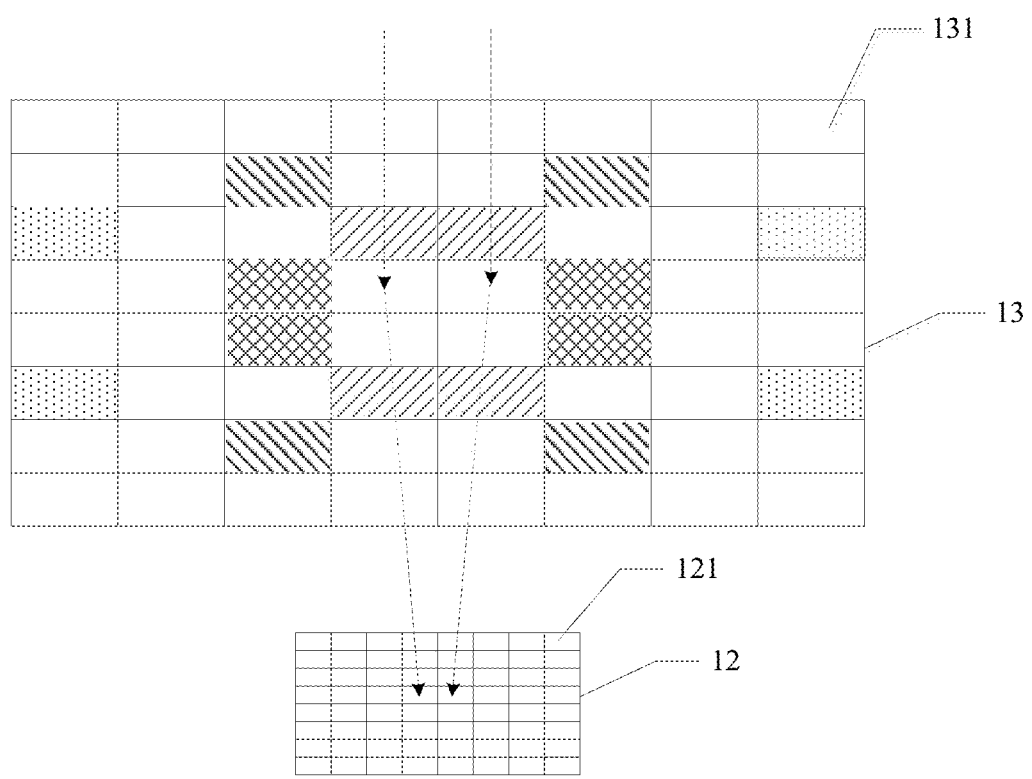
FIG. 7 is a schematic diagram of a distribution of a refractive index of a lens assembly in a fingerprint recognition display device according to the embodiments of the disclosure.

In some embodiments, as illustrated in FIG. 7, a center of the fingerprint recognition sensor coincides with a center of the lens assembly 13, and refractive indexes of lenses in respective lens areas 131 distributed central-symmetrically around the center of the lens assembly 13 are the same (e.g., in areas with the same patterns as illustrated in FIG. 7).

It shall be noted that, the shapes of the respective areas will not be limited to rectangles in the embodiment above, and for example, for a circular display device, when the center of the fingerprint recognition sensor coincides with the center of the lens assembly 13, the respective areas (including respective lens areas, or respective recognition areas) can alternatively be shaped as circular sectors, semi-circles, or circular rings.

In summary, in the technical solution according to the embodiments of the disclosure, the collimator, the lens assembly, and the fingerprint recognition sensor with a smaller size than that of the display panel are arranged on the other side of the display panel than the light-emitting side thereof in that order; where the collimator receives the light rays reflected by the finger, and converts the light rays into the collimated light incident on the lens assembly, and then the lens assembly converges the incident collimated light onto the fingerprint recognition sensor to form the fingerprint image. In this solution, the fingerprint can be recognized in a full-screen mode using the fingerprint recognition sensor with a small size to thereby lower the cost of the product.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A fingerprint recognition display device, comprising: a display panel, a fingerprint recognition sensor arranged on a side of the display panel other than a light-emitting side thereof, and a lens assembly and a collimator arranged between the fingerprint recognition sensor and the display panel; wherein the collimator is arranged on a surface of the display panel facing away from the light-emitting side, and the lens assembly is arranged on a surface of the collimator on a side thereof facing away from the display panel, wherein:

a size of the fingerprint recognition sensor is smaller than a size of the display panel;

the collimator is configured to receive light rays reflected by a finger, and to convert the light rays into collimated light incident on the lens assembly; and the lens assembly is configured to converge the incident collimated light onto the fingerprint recognition sensor;

wherein an orthographic projection of the lens assembly onto a plane where the display panel lies completely coincides with the display panel; and an orthographic projection of the collimator onto the plane where the display panel lies completely coincides with the display panel;

wherein the lens assembly comprises a plurality of lens areas, the fingerprint recognition sensor comprises a plurality of recognition areas, and the plurality of lens areas correspond to the plurality of recognition areas in a one-to-one manner; and a lens in each of the plurality of lens areas is configured to converge collimated light incident on each of the plurality of lens areas onto a corresponding recognition area of the fingerprint recognition sensor to form a fingerprint image; and wherein refractive indexes of respective lenses in a same lens area are same, and refractive indexes of respective lens areas decrease gradually from an edge region of the lens assembly to a center of a region in the lens assembly that faces the fingerprint recognition sensor.

2. The fingerprint recognition display device according to claim 1, wherein the lens in each of the plurality of lens areas is configured to converge the collimated light incident on each of the plurality of lens areas onto the corresponding recognition area of the fingerprint recognition sensor to form a part of the fingerprint image; and the fingerprint recognition sensor is further configured to integrate a plurality of parts of the fingerprint image into a complete fingerprint image.

3. The fingerprint recognition display device according to claim 1, wherein the lens in each of the plurality of lens areas is configured to converge the collimated light incident on each of the plurality of lens areas onto the corresponding recognition area of the fingerprint recognition sensor to form a complete fingerprint image.

4. The fingerprint recognition display device according to claim 1, wherein a center of the fingerprint recognition sensor coincides with a center of the lens assembly; and refractive indexes of lenses in respective lens area distributed central-symmetrically around the center of the lens assembly are same.

5. The fingerprint recognition display device according to claim 1, wherein lens materials of respective lens areas with different refractive indexes are different, and refractive indexes of different lens materials are different.

6. The fingerprint recognition display device according to claim 1, wherein lens materials of respective lens areas with different refractive indexes are same, and doped with different kinds of dopants.

7. The fingerprint recognition display device according to claim 6, wherein the dopants comprise metallic balls or organic materials.

8. The fingerprint recognition display device according to claim 1, wherein lens materials of respective lens areas with different refractive indexes are same, and doped with a same kind of dopant at different dosages.

9. The fingerprint recognition display device according to claim 8, wherein the dopant comprises metallic balls or an organic material.

10. The fingerprint recognition display device according to claim 1, wherein the lens in each of the plurality of lens areas comprises: a first electrode, a second electrode, and an electro-optical material layer arranged between the first electrode and the second electrode; and a refractive index of each of the plurality of lens areas is controlled by voltage applied to the first electrode and the second electrode.

11. The fingerprint recognition display device according to claim 10, wherein the first electrode and the second electrode are transparent electrodes.

12. The fingerprint recognition display device according to claim 1, wherein a surface of the lens assembly proximate to the collimator is arranged as a flat surface and a surface of the lens assembly proximate to the fingerprint recognition sensor is arranged as a curved surface.

13. The fingerprint recognition display device according to claim 1, wherein shapes of respective lens areas are rectangles, circular sectors, semicircles, or circular rings; and shapes of respective recognition areas are rectangles, circular sectors, semicircles, or circular rings.

14. The fingerprint recognition display device according to claim 1, wherein the collimator is an optical collimator.

15. The fingerprint recognition display device according to claim 1, wherein the fingerprint recognition sensor comprises a Complementary Metal Oxide Semiconductor (CMOS), or a Charge Coupled Diode (CDD).

16. The fingerprint recognition display device according to claim 1, wherein a gap exists between the lens assembly and the fingerprint recognition sensor; and air, or light transmitting filler with a uniform refractive index is filled in the gap.

17. The fingerprint recognition display device according to claim 1, wherein the display panel is an Organic Light-Emitting Diode (OLED) display panel or an inorganic light-emitting diode display panel.

* * * * *